US012689225B2

(12) United States Patent
Takao

(10) Patent No.:  US 12,689,225 B2
(45) Date of Patent:      Jul. 21, 2026

(54) MANAGEMENT DEVICE AND POWER SUPPLY SYSTEM

(71) Applicant: Panasonic Intellectual Property Management Co., Ltd., Osaka (JP)

(72) Inventor: Hiroshi Takao, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 825 days.

(21) Appl. No.: 18/041,690

(22) PCT Filed: Aug. 30, 2021

(86) PCT No.: PCT/JP2021/031645
§ 371 (c)(1),
(2) Date: Feb. 14, 2023

(87) PCT Pub. No.: WO2022/070715
PCT Pub. Date: Apr. 7, 2022

(65) Prior Publication Data
US 2023/0396074 A1      Dec. 7, 2023

(30) Foreign Application Priority Data

Sep. 29, 2020      (JP) ................................. 2020-163853

(51) Int. Cl.
*H02J 7/50*          (2026.01)
*B60L 58/12*        (2019.01)
(Continued)

(52) U.S. Cl.
CPC ................ *H02J 7/50* (2026.01); *B60L 58/12* (2019.02); *B60L 58/22* (2019.02);
(Continued)

(58) Field of Classification Search
CPC ...... H02J 7/0013; H02J 7/0014; H02J 7/0048; H02J 7/007182; H02J 7/1423; H02J 7/50;
(Continued)

(56) References Cited

U.S. PATENT DOCUMENTS

| | | | | | |
|---|---|---|---|---|---|
| 5,670,861 | A | * | 9/1997 | Nor ......................... | H02J 7/663 340/636.15 |
| 5,773,962 | A | * | 6/1998 | Nor ......................... | H02J 7/663 320/122 |

(Continued)

FOREIGN PATENT DOCUMENTS

| | | | |
|---|---|---|---|
| JP | 2009-033936 | 2/2009 | |
| WO | 2012/164630 | 12/2012 | |
| WO | WO-2018225417 A1 * | 12/2018 | ............ H01M 10/48 |

OTHER PUBLICATIONS

"State of Charge, Health and Power in batteries. Definition," R Ramon, Epic Power Converters S.L. , published online May 2020, accessed Online Nov. 19, 2025, https://epicpower.es/wp-content/uploads/2020/08/AN028_SoC-SoH-SoP-definitions_v3.pdf (Year: 2020).*

(Continued)

*Primary Examiner* — John T Trischler
(74) *Attorney, Agent, or Firm* — Rimon P.C.

(57)          ABSTRACT

Management device manages storage modules each parallel-connected to power supply through switch. Determination unit of management device, in a state where switches connected to some of power storage modules in the power storage modules are on; and switches connected to the remaining power storage modules are off, when at least one of the off-state switches are turned on, determination unit does not permit the switch to be turned on when a maximum value of current or power allowed to charge all of the power (Continued)

storage modules is lower than a threshold based on the maximum before the switches are is turned on.

7 Claims, 7 Drawing Sheets

(51) Int. Cl.

| | |
|---|---|
| *B60L 58/22* | (2019.01) |
| *H01M 10/44* | (2006.01) |
| *H01M 50/512* | (2021.01) |
| *H02J 7/14* | (2006.01) |
| *H02J 7/52* | (2026.01) |
| *H02J 7/82* | (2026.01) |
| *H02J 7/96* | (2026.01) |
| *B60L 53/14* | (2019.01) |
| *G01R 31/396* | (2019.01) |
| *H02J 7/34* | (2006.01) |
| *H02J 105/37* | (2026.01) |

(52) U.S. Cl.
CPC ....... *H01M 10/441* (2013.01); *H01M 50/512* (2021.01); *H02J 7/1423* (2013.01); *H02J 7/52* (2026.01); *H02J 7/82* (2026.01); *H02J 7/96* (2026.01); *B60L 53/14* (2019.02); *B60L 2240/547* (2013.01); *B60L 2240/549* (2013.01); *G01R 31/396* (2019.01); *H01M 10/44* (2013.01); *H01M 2220/20* (2013.01); *H02J 7/34* (2013.01); *H02J 2105/37* (2026.01); *Y02T 10/7072* (2013.01); *Y02T 90/14* (2013.01)

(58) Field of Classification Search
CPC ...... H02J 7/52; H02J 7/82; H02J 7/96; H01M 10/441; B60L 58/12; B60L 58/22
USPC .................................................. 320/162, 126
See application file for complete search history.

(56) References Cited

U.S. PATENT DOCUMENTS

| | | | | | |
|---|---|---|---|---|---|
| 6,204,633 | B1 * | 3/2001 | Kitagawa | ................... | H02J 7/34 |
| | | | | | 320/128 |
| 6,445,164 | B2 * | 9/2002 | Kitagawa | ................... | H02J 7/34 |
| | | | | | 320/134 |
| 6,624,613 | B2 * | 9/2003 | Kitagawa | .............. | H02J 7/0068 |
| | | | | | 320/135 |
| 6,707,271 | B2 * | 3/2004 | Kitagawa | .............. | H02J 7/0068 |
| | | | | | 320/134 |
| 7,064,521 | B2 * | 6/2006 | Stanesti | .................... | H02J 7/02 |
| | | | | | 320/149 |
| 7,075,306 | B2 * | 7/2006 | Emori | ................... | H02J 7/0048 |
| | | | | | 324/426 |
| 7,319,333 | B2 * | 1/2008 | Emori | ................... | H02J 7/0048 |
| | | | | | 324/426 |
| 7,414,381 | B2 * | 8/2008 | Popescu-Stanesti | ......................... | |
| | | | | | H02J 7/0018 |
| | | | | | 320/149 |
| 7,692,430 | B2 * | 4/2010 | Emori | ................... | H02J 7/0048 |
| | | | | | 324/426 |
| 8,120,365 | B2 * | 2/2012 | Emori | ................... | H02J 7/0016 |
| | | | | | 324/426 |
| 8,643,334 | B2 * | 2/2014 | Kuo | ...................... | H02J 7/0019 |
| | | | | | 320/122 |
| 8,653,792 | B2 * | 2/2014 | Nishida | ................. | H02J 7/0014 |
| | | | | | 320/116 |
| 8,798,832 | B2 * | 8/2014 | Kawahara | .............. | B60L 58/26 |
| | | | | | 701/32.7 |
| 9,030,167 | B2 * | 5/2015 | Yamaguchi | ......... | H01M 10/441 |
| | | | | | 320/117 |
| 9,112,247 | B2 * | 8/2015 | Yamauchi | .......... | H01M 10/425 |

| | | | | | |
|---|---|---|---|---|---|
| 9,166,419 | B2 * | 10/2015 | Girard | ................... | H02J 7/0068 |
| 9,187,000 | B2 * | 11/2015 | Kuwano | .............. | H02J 7/0019 |
| 9,211,800 | B2 * | 12/2015 | Nishi | ..................... | B60L 58/18 |
| 9,368,992 | B2 * | 6/2016 | Suzuki | .................. | H02J 7/0025 |
| 9,748,778 | B2 * | 8/2017 | Toya | ......................... | H02J 7/00 |
| 10,075,002 | B2 * | 9/2018 | Heishi | .................... | B60L 53/80 |
| 10,110,033 | B1 * | 10/2018 | Hom | ............... | H02J 7/007182 |
| 10,205,327 | B2 * | 2/2019 | Okui | .................. | H02J 7/0025 |
| 10,232,728 | B2 * | 3/2019 | Butzmann | ......... | H01M 10/4257 |
| 10,333,328 | B1 * | 6/2019 | Hom | ..................... | H02J 7/0013 |
| 10,396,589 | B2 * | 8/2019 | Kamikawa | ........ | H01M 10/4207 |
| 10,461,545 | B2 * | 10/2019 | Inoue | .................. | H02J 7/0068 |
| 10,608,451 | B2 * | 3/2020 | Heishi | .................... | H02J 50/30 |
| 10,673,252 | B2 * | 6/2020 | Hom | ......................... | H02J 7/00 |
| 10,790,678 | B2 * | 9/2020 | Zheng | .................. | H02J 7/0014 |
| 10,819,124 | B2 * | 10/2020 | Li | ...................... | H01M 10/441 |
| 10,868,430 | B1 * | 12/2020 | Hom | ............... | H02J 7/007182 |
| 11,043,821 | B2 * | 6/2021 | Nishikawa | ............ | H02J 7/0013 |
| 11,050,288 | B2 * | 6/2021 | Kamikawa | ........ | H01M 10/4207 |
| 11,056,886 | B2 * | 7/2021 | Kato | ...................... | H02J 7/02 |
| 11,158,888 | B2 * | 10/2021 | Yamasaki | ............ | H01M 10/48 |
| 11,230,205 | B2 * | 1/2022 | Ohmori | .................. | B60L 58/22 |
| 11,239,519 | B2 * | 2/2022 | Nishikawa | ............... | H02J 1/10 |
| 11,277,013 | B2 * | 3/2022 | Watanabe | .......... | H01M 10/482 |
| 11,336,111 | B2 * | 5/2022 | Beaston | ............... | H02J 7/0048 |
| 11,349,144 | B2 * | 5/2022 | Qiao | ................... | H02J 7/0024 |
| 11,398,734 | B2 * | 7/2022 | Singer | .................. | H02J 7/0014 |
| 11,515,712 | B2 * | 11/2022 | Lee | ...................... | H02J 7/0063 |
| 11,543,458 | B2 * | 1/2023 | Jan | ....................... | H02J 7/0048 |
| 11,594,895 | B2 * | 2/2023 | Ino | ...................... | H02J 7/0014 |
| 11,605,839 | B2 * | 3/2023 | Shine | .............. | H01M 10/4207 |
| 11,642,952 | B2 * | 5/2023 | Zeiler | .................... | B60L 53/80 |
| | | | | | 307/9.1 |
| 11,677,260 | B2 * | 6/2023 | Li | ............................. | H02J 7/36 |
| | | | | | 320/116 |
| 11,820,218 | B2 * | 11/2023 | Zeiler | .................. | H02J 7/0063 |
| 11,843,278 | B2 * | 12/2023 | Beaston | .................. | H02J 9/06 |
| 11,949,273 | B2 * | 4/2024 | Zhong | .............. | H02J 7/007182 |
| 11,955,821 | B2 * | 4/2024 | Li | ........................... | H02J 7/575 |
| 12,032,030 | B2 * | 7/2024 | Jan | ....................... | H02J 7/0048 |
| 12,040,460 | B2 * | 7/2024 | Books | .................. | B60L 53/62 |
| 12,155,243 | B2 * | 11/2024 | Zheng | ............... | H02J 7/00302 |
| 12,179,631 | B2 * | 12/2024 | Takao | ................... | H02J 7/0016 |
| 12,212,181 | B2 * | 1/2025 | Beaston | ................... | H02J 3/32 |
| 12,291,091 | B2 * | 5/2025 | Zeiler | ............... | H01M 10/441 |
| 12,301,028 | B2 * | 5/2025 | Furukawa | ............ | H02J 7/0019 |
| 12,355,295 | B2 * | 7/2025 | Yoon | ...................... | B60L 58/22 |
| 12,576,741 | B2 * | 3/2026 | Hao | ........................ | B60L 53/62 |
| 2001/0007417 | A1 * | 7/2001 | Kitagawa | ................. | H02J 7/34 |
| | | | | | 320/128 |
| 2002/0057073 | A1 * | 5/2002 | Kitagawa | ................. | H02J 7/34 |
| | | | | | 320/135 |
| 2002/0171399 | A1 * | 11/2002 | Kitagawa | .............. | H02J 7/0068 |
| | | | | | 320/134 |
| 2004/0113585 | A1 * | 6/2004 | Stanesti | .................... | H02J 7/02 |
| | | | | | 320/116 |
| 2004/0138785 | A1 * | 7/2004 | Emori | ................... | H02J 7/0016 |
| | | | | | 700/286 |
| 2006/0012372 | A1 * | 1/2006 | Emori | ................... | H02J 7/0048 |
| | | | | | 324/413 |
| 2006/0109008 | A1 * | 5/2006 | Emori | ................... | H02J 7/0016 |
| | | | | | 324/430 |
| 2006/0244420 | A1 * | 11/2006 | Stanesti | ................. | H02J 7/0025 |
| | | | | | 320/128 |
| 2008/0084179 | A1 * | 4/2008 | Emori | ................... | H02J 7/0016 |
| | | | | | 290/31 |
| 2009/0045775 | A1 * | 2/2009 | Popescu Stanesti | ...... | H02J 7/34 |
| | | | | | 320/126 |
| 2010/0148728 | A1 * | 6/2010 | Emori | ................... | H02J 7/0013 |
| | | | | | 320/134 |
| 2011/0074354 | A1 * | 3/2011 | Yano | ................... | H01M 10/482 |
| | | | | | 180/65.29 |
| 2011/0127964 | A1 * | 6/2011 | Nishida | ................. | H01M 10/44 |
| | | | | | 320/118 |
| 2011/0313613 | A1 * | 12/2011 | Kawahara | .............. | B60L 50/61 |
| | | | | | 320/134 |
| 2012/0223677 | A1 * | 9/2012 | Yamauchi | ................ | H02J 7/34 |
| | | | | | 320/134 |

(56) References Cited

U.S. PATENT DOCUMENTS

| | | | | |
|---|---|---|---|---|
| 2012/0248869 | A1* | 10/2012 | Itagaki | H02J 7/0049 |
| | | | | 307/9.1 |
| 2012/0262121 | A1* | 10/2012 | Kuo | H02J 7/0019 |
| | | | | 320/128 |
| 2012/0313439 | A1* | 12/2012 | Yamaguchi | H02J 7/0016 |
| | | | | 307/71 |
| 2013/0063091 | A1* | 3/2013 | Nishi | H01M 10/441 |
| | | | | 320/126 |
| 2013/0106357 | A1* | 5/2013 | Girard | B60L 58/26 |
| | | | | 320/126 |
| 2013/0320930 | A1* | 12/2013 | Suzuki | H01M 10/482 |
| | | | | 320/135 |
| 2014/0077731 | A1* | 3/2014 | Kuwano | H02J 7/0014 |
| | | | | 320/126 |
| 2014/0103859 | A1 | 4/2014 | Nishi | |
| 2015/0022140 | A1* | 1/2015 | Heishi | H02J 7/0045 |
| | | | | 320/108 |
| 2015/0145476 | A1* | 5/2015 | Toya | H01M 10/441 |
| | | | | 320/109 |
| 2015/0222132 | A1* | 8/2015 | Shikatani | H01M 10/0445 |
| | | | | 320/117 |
| 2016/0226268 | A1* | 8/2016 | Okui | H02J 7/0014 |
| 2016/0332528 | A1* | 11/2016 | Butzmann | H02J 1/10 |
| 2017/0141589 | A1* | 5/2017 | Inoue | H02J 7/0068 |
| 2017/0163060 | A1* | 6/2017 | Zheng | H02J 7/0019 |
| 2017/0229902 | A1* | 8/2017 | Kamikawa | H01M 10/441 |
| 2018/0241097 | A1* | 8/2018 | Yamasaki | H01M 10/441 |
| 2018/0262032 | A1* | 9/2018 | Heishi | H02J 1/001 |
| 2019/0109306 | A1* | 4/2019 | Nishikawa | H01M 10/6563 |
| 2019/0160972 | A1* | 5/2019 | Zeiler | H01M 10/441 |
| 2019/0214833 | A1* | 7/2019 | Li | H01M 10/441 |
| 2019/0245237 | A1* | 8/2019 | Qiao | H02J 7/0025 |
| 2019/0260216 | A1* | 8/2019 | Hom | H02J 7/0013 |
| 2019/0334370 | A1* | 10/2019 | Kamikawa | H02J 7/0014 |
| 2020/0127458 | A1* | 4/2020 | Kato | H01M 10/425 |
| 2020/0127467 | A1* | 4/2020 | Li | H02J 7/36 |
| 2020/0161875 | A1 | 5/2020 | Nishikawa et al. | |
| 2020/0169105 | A1* | 5/2020 | Watanabe | H02J 3/32 |
| 2020/0333402 | A1* | 10/2020 | Jan | H01M 50/20 |
| 2020/0361337 | A1* | 11/2020 | Ohmori | H02J 7/02 |
| 2020/0373764 | A1* | 11/2020 | Lee | H02J 7/0063 |
| 2020/0403430 | A1* | 12/2020 | Zheng | H02J 7/00306 |
| 2020/0412135 | A1* | 12/2020 | Singer | H02J 7/0014 |
| 2021/0006078 | A1* | 1/2021 | Zheng | H02J 7/0014 |
| 2021/0083505 | A1* | 3/2021 | Beaston | H02J 3/381 |
| 2021/0206290 | A1* | 7/2021 | Li | B60L 58/14 |
| 2021/0226267 | A1* | 7/2021 | Books | H02J 7/14 |
| 2021/0249701 | A1* | 8/2021 | Shine | H01M 10/4207 |
| 2021/0354541 | A1* | 11/2021 | Zeiler | H01M 10/441 |
| 2021/0408806 | A1* | 12/2021 | Stanke | H02J 7/0025 |
| 2022/0029428 | A1* | 1/2022 | Ino | H02J 1/102 |
| 2022/0123576 | A1* | 4/2022 | Zhong | G01R 31/3835 |
| 2022/0271540 | A1* | 8/2022 | Furukawa | H02J 7/0016 |
| 2022/0274498 | A1* | 9/2022 | Huang | B60L 53/22 |
| 2022/0285951 | A1* | 9/2022 | Yoon | B60L 58/13 |
| 2022/0355700 | A1* | 11/2022 | Ishii | H02J 7/00716 |
| 2022/0360105 | A1* | 11/2022 | Beaston | H02J 7/0048 |
| 2023/0163371 | A1* | 5/2023 | Shine | H01M 10/465 |
| | | | | 429/50 |
| 2023/0166634 | A1* | 6/2023 | Höckenström | H02J 7/0063 |
| | | | | 307/10.1 |
| 2023/0208152 | A1* | 6/2023 | Stanke | H02J 7/0016 |
| | | | | 320/134 |
| 2023/0219460 | A1* | 7/2023 | Takao | H02J 7/0016 |
| | | | | 307/9.1 |
| 2023/0221371 | A1* | 7/2023 | Jan | H02J 7/0048 |
| | | | | 320/112 |
| 2023/0234432 | A1* | 7/2023 | Zeiler | H01M 10/425 |
| | | | | 307/9.1 |
| 2023/0246469 | A1* | 8/2023 | Ebisawa | H01M 50/20 |
| | | | | 320/126 |
| 2023/0268763 | A1* | 8/2023 | Li | H02J 7/575 |
| | | | | 320/116 |
| 2023/0311706 | A1* | 10/2023 | Takao | H02J 7/0013 |
| | | | | 307/10.1 |
| 2024/0157832 | A1* | 5/2024 | Hao | B60L 53/62 |
| 2024/0258826 | A1* | 8/2024 | Beaston | H02J 7/02 |
| 2024/0343146 | A1* | 10/2024 | Huang | B60L 53/22 |
| 2024/0361392 | A1* | 10/2024 | Jan | G01R 31/3835 |
| 2024/0424950 | A1* | 12/2024 | Tamba | H01M 10/425 |
| 2025/0141241 | A1* | 5/2025 | Furukawa | H01M 10/425 |
| 2025/0162397 | A1* | 5/2025 | Zeiler | H01M 50/213 |

OTHER PUBLICATIONS

International Search Report of PCT application No. PCT/JP2021/031645 dated Oct. 26, 2021.
The EPC Office Action dated Jun. 20, 2024 for the related European Patent Application No. 21875018.0.

* cited by examiner

Maximum charging current

Maximum charging current

FIG. 9

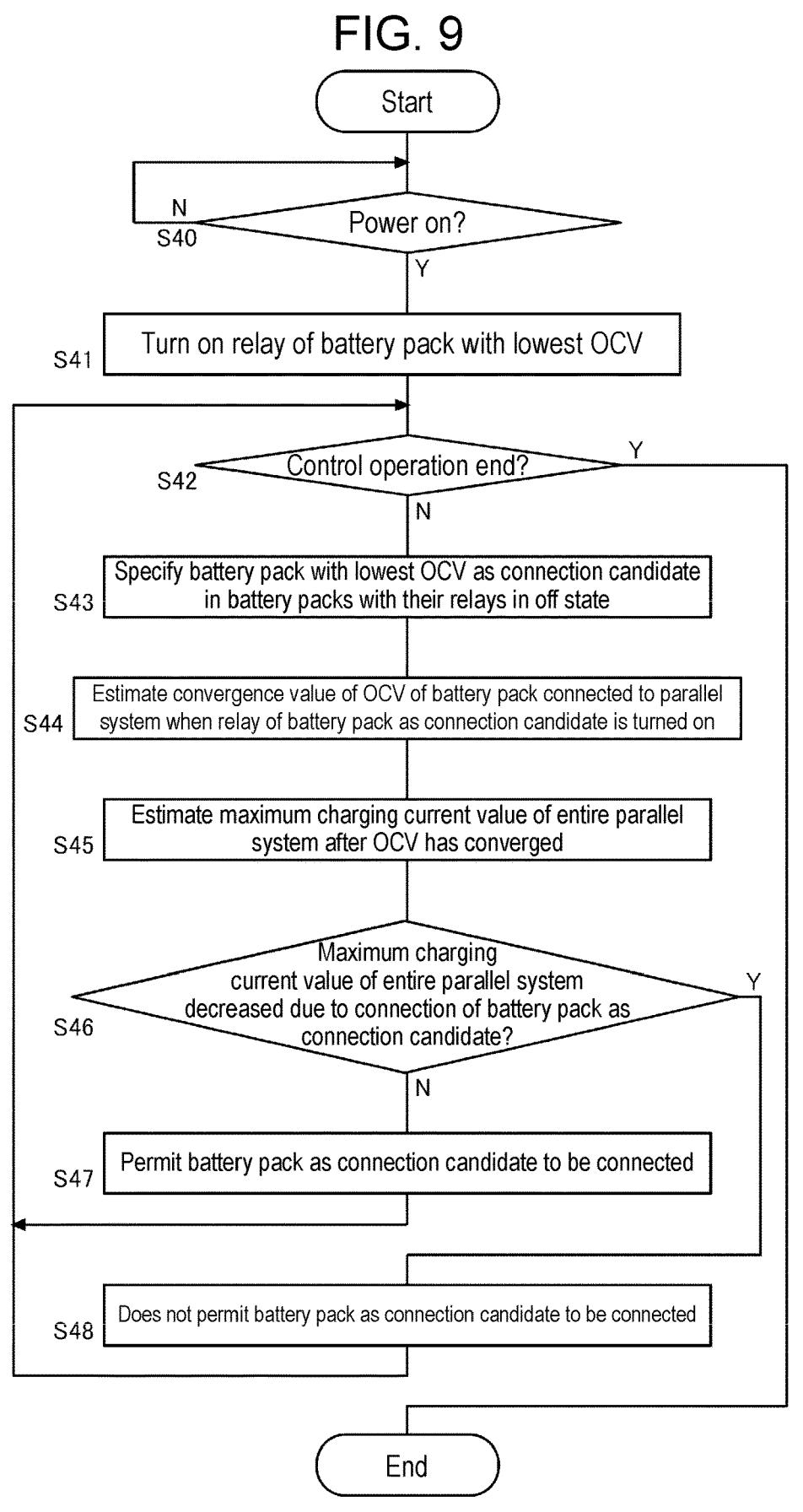

```
                          ┌─────────┐
                          │  Start  │
                          └─────────┘
                               │
          ┌────────────────────┤
          │        N  ◇─────────────────◇
          │       ◇   Power on?          ◇
          │  S40   ◇─────────────────────◇
          │                    │ Y
          │                    ▼
          │         ┌──────────────────────────────────────┐
     S41  │         │ Turn on relay of battery pack with    │
          │         │ lowest OCV                            │
          │         └──────────────────────────────────────┘
          │                    │
   ┌──────┼────────────────────┤
   │      │          ◇──────────────────────◇  Y
   │      │    S42  ◇  Control operation end? ◇──────┐
   │      │          ◇──────────────────────◇        │
   │      │                    │ N                    │
   │      │                    ▼                      │
   │      │   ┌────────────────────────────────────────────┐
   │ S43  │   │ Specify battery pack with lowest OCV as     │
   │      │   │ connection candidate in battery packs with  │
   │      │   │ their relays in off state                   │
   │      │   └────────────────────────────────────────────┘
   │      │                    │
   │      │                    ▼
   │      │   ┌────────────────────────────────────────────┐
   │ S44  │   │ Estimate convergence value of OCV of battery│
   │      │   │ pack connected to parallel system when relay│
   │      │   │ of battery pack as connection candidate is  │
   │      │   │ turned on                                   │
   │      │   └────────────────────────────────────────────┘
   │      │                    │
   │      │                    ▼
   │      │   ┌────────────────────────────────────────────┐
   │ S45  │   │ Estimate maximum charging current value of  │
   │      │   │ entire parallel system after OCV has        │
   │      │   │ converged                                   │
   │      │   └────────────────────────────────────────────┘
   │      │                    │
   │      │                    ▼
   │      │          ◇────────────────────────◇  Y
   │      │    S46  ◇ Maximum charging current  ◇────┐
   │      │          ◇ value of entire parallel  ◇    │
   │      │          ◇ system decreased...       ◇    │
   │      │          ◇────────────────────────◇       │
   │      │                    │ N                     │
   │      │                    ▼                       │
   │      │   ┌────────────────────────────────────────────┐
   │ S47  │   │ Permit battery pack as connection candidate │
   │      │   │ to be connected                             │
   │      │   └────────────────────────────────────────────┘
   │      │                    │                       │
   │      └────────────────────┤                       │
   │                           ▼                       │
   │          ┌────────────────────────────────────────────┐
   │  S48     │ Does not permit battery pack as connection   │
   │          │ candidate to be connected                   │
   │          └────────────────────────────────────────────┘
   │                           │                       │
   └───────────────────────────┘                       │
                                                       │
                          ┌─────────┐                  │
                          │   End   │◄─────────────────┘
                          └─────────┘
```

S40 — Power on? (N loops back)

S41 — Turn on relay of battery pack with lowest OCV

S42 — Control operation end? (Y → End)

S43 — Specify battery pack with lowest OCV as connection candidate in battery packs with their relays in off state S44 — Estimate convergence value of OCV of battery pack connected to parallel system when relay of battery pack as connection candidate is turned on S45 — Estimate maximum charging current value of entire parallel system after OCV has converged S46 — Maximum charging current value of entire parallel system decreased due to connection of battery pack as connection candidate?

S47 — Permit battery pack as connection candidate to be connected

S48 — Does not permit battery pack as connection candidate to be connected

MANAGEMENT DEVICE AND POWER SUPPLY SYSTEM

BACKGROUND

Technical Field

The present disclosure relates to a management device that manages two or more power storage modules parallel-connected to a power supply and relates to a power supply system.

Description of the Related Art

In recent years, electromotive vehicles with relatively low output (e.g., driven at 48 V) have become widely used, such as an electromotive bike, electromotive golf cart, electromotive land car, and forklift. Some of them use a power supply system having detachable, interchangeable battery packs connected in parallel with one another. Such parallel connection can cause a cross current.

To parallel-connect battery packs paralleled off, a cross current can cause a current exceeding a rated current flowing through the battery packs and/or relays. Control operation to prevent such a current has been devised (refer to PTL 1 for instance). Another control operation has been devised (refer to PTL 2 for instance) that estimates transient voltage when parallel connection between the batteries is interrupted and turns off the relays if the transient voltage is going to exceed the rated voltage of the relays.

Citation List

Patent Literature

[PTL 1] Japanese Patent Unexamined Publication No. 2009-33936
[PTL 2] WO 2012/164630

SUMMARY

Parallel connection of battery packs paralleled off while they are charged usually increases the maximum value of current or power allowed to charge the entire parallel system. However, a cross current caused by the parallel-connection can decrease the maximum value from that before the parallel-connection. The lower maximum value can cause disadvantageous effects such as a longer charging time and a lower regenerative brake force.

The present disclosure has been made in view of these circumstances. Its objective is to provide a technology that prevents the charging efficiency from decreasing in charging a parallel system.

To solve the above-described problem, a management device of an aspect of the disclosure manages two or more power storage modules each parallel-connected to a power supply through a switch. The management device includes a determination unit that works as follows. That is, in a state where switches connected to some of the power storage modules are on; and switches connected to the remaining power storage modules are off, when at least one of the off-state switches are turned on, the determination unit does not permit the relevant switch to be turned on when the maximum value of current or power allowed to charge the entire parallel system is lower than a threshold based on the relevant maximum value before the relevant switch is turned on, if the relevant switch is turned on.

The present disclosure allows preventing the charging efficiency from decreasing when a parallel system is charged.

BRIEF DESCRIPTION OF THE DRAWINGS

FIG. 9 is a flowchart for illustrating the determination process in parallel connection according to the second exemplary embodiment.

DETAILED DESCRIPTIONS

Figure 1:
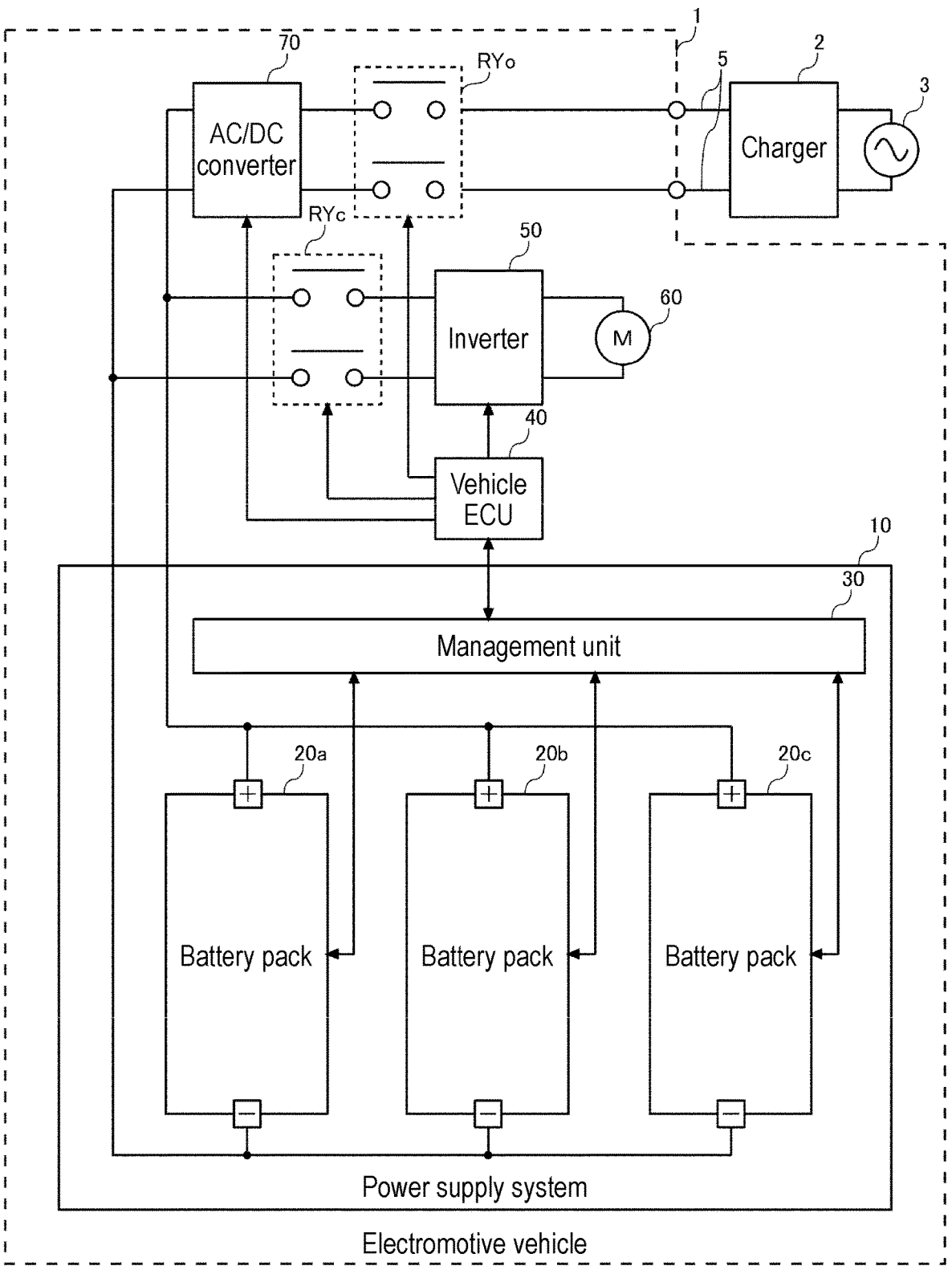
FIG. 1 illustrates an electromotive vehicle incorporating a power supply system according to an exemplary embodiment.

FIG. 1 illustrates electromotive vehicle 1 incorporating power supply system 10 according to an exemplary embodiment. Electromotive vehicle 1 uses interchangeable battery packs 20 as its power supply, such as an electromotive bike, electromotive golf cart, electromotive land car, and forklift. Battery pack 20 is a detachable, portable, interchangeable battery pack, which is attached to a mounting slot of electromotive vehicle 1 by a user.

Power supply system 10 is connected to motor 60 through main relay RYc and inverter 50. During power running, inverter 50 converts DC power supplied from power supply system 10 to AC power and supplies the AC power to motor 60. During regeneration, AC power supplied from motor 60 is converted to DC power and is supplied to power supply system 10. During power running, motor 60, which is a three-phase AC motor, rotates in response to AC power supplied from inverter 50. During regeneration, rotation energy caused by deceleration is converted to AC power and is supplied to inverter 50.

Vehicle ECU (electronic control unit) 40 is a control device that controls entire electromotive vehicle 1. Main relay RYc is a contactor inserted to halfway across the wiring connecting power supply system 10 with inverter 50. While electromotive vehicle 1 is travelling, vehicle ECU 40 controls main relay RYc to the on state (closed state) to electrically connect power supply system 10 with the power system of electromotive vehicle 1. While electromotive vehicle 1 is not travelling, vehicle ECU 40 controls main relay RYc to the off state (open state) to electrically disconnect power supply system 10 from the power system of electromotive vehicle 1. Here, another type of switch (e.g., semiconductor switch) may be used instead of a relay.

Electromotive vehicle 1 can be connected to charger 2 through charging cable 5. Charger 2 is connected to a commercial power series (hereinafter, simply referred to as series 3) and charges battery pack 20 inside power supply system 10 from the outside of electromotive vehicle 1.

Charger 2 of a normal type typically charges battery pack 20 with AC power of single-phase 100/200V. In this case, the line between charger 2 and battery pack 20 conducts through charging cable 5, external charging relay RYo, and AC/DC converter 70.

While charger 2 is charging, vehicle ECU 40 controls external charging relay RYo to the on state. Here, another type of switch (e.g., semiconductor switch) may be used instead of a relay. AC/DC converter 70 includes a rectifier circuit and a DC/DC converter. The rectifier circuit rectifies AC power supplied from charger 2 to generate DC power. The DC/DC converter controls current or voltage of DC power generated by the rectifier circuit in response to a current command value or voltage command value specified by vehicle ECU 40. This allows constant current (CC) charge or constant voltage (CV) charge to be executed.

Charger 2 of a rapid type rectifies AC power supplied from series 3 to generate DC power. For a fast-charging standard, CHAdeMO (registered trademark), GB/T, and Combo (combined charging system) for instance can be used.

Charging cable 5 supporting fast charging contains a communication line in addition to a power line. Vehicle ECU 40 can transmit a current command value or voltage command value to charger 2 through the communication line. Charger 2 controls current or voltage of DC power to be output in response to a current command value or voltage command value received from vehicle ECU 40. In this case, AC/DC converter 70 inside electromotive vehicle 1 is bypassed. Here, the following process may be performed. That is, only the rectifier circuit of AC/DC converter 70 is bypassed, and current or voltage of DC power is not controlled by charger 2 but by the DC/DC converter inside AC/DC converter 70.

In the example shown in FIG. 1, charging is performed with battery pack 20 attached to electromotive vehicle 1. Here, charging can be also performed with battery pack 20 separated from electromotive vehicle 1. In this case, battery pack 20 can be charged by attaching battery pack 20 to a charge base outside electromotive vehicle 1.

Power supply system 10 includes battery packs 20a through 20c and management unit 30. Battery packs 20a through 20c are connected in parallel with the load (mainly motor 60) of electromotive vehicle 1. Here, motor 60 becomes a power supply to battery packs 20a through 20c during regeneration. The number of parallel paths of battery packs 20 is determined in response to the required capacity or required output of electromotive vehicle 1. FIG. 1 shows an example of three battery packs 20a through 20c parallel-connected, but not limited to three parallel paths. To extend the range, more battery packs 20 may be parallel connected. Small electromotive vehicle 1 may be of two parallel paths.

Figure 2:
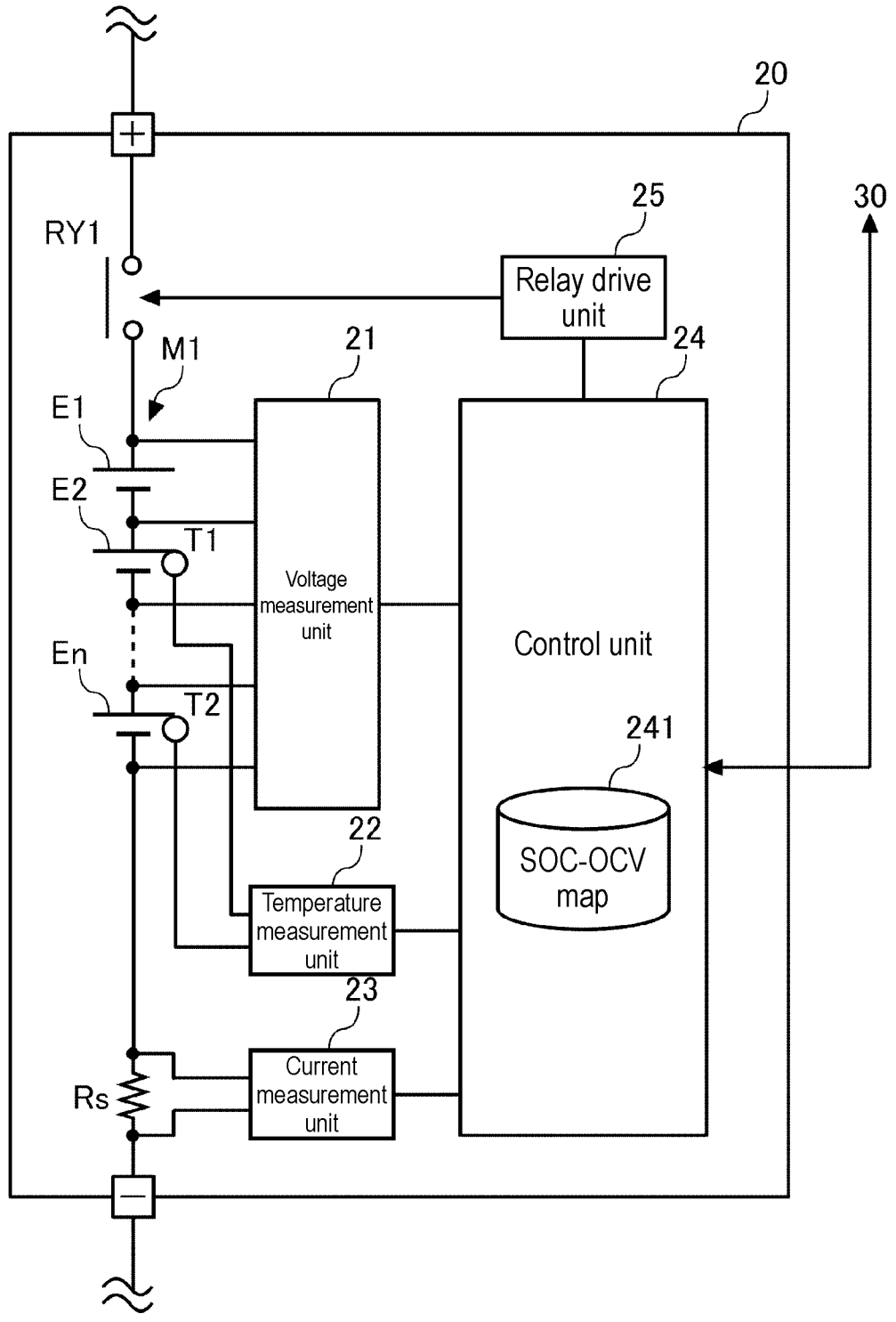
FIG. 2 shows an example internal configuration of the battery pack in FIG. 1.

FIG. 2 shows an example internal configuration of battery pack 20 in FIG. 1. Battery pack 20 includes pack relay RY1, relay drive unit 25, battery module M1, shunt resistance Rs, temperature sensors T1 and T2, voltage measurement unit 21, temperature measurement unit 22, current measurement unit 23, and control unit 24. Relay drive unit 25 turns on and off pack relay RY1 in response to a control signal received from management unit 30 through control unit 24.

Battery module M1 includes series-connected cells E1 through En. Battery module M1 may be composed of series-connected cell blocks made of parallel-connected cells. The cells may be lithium-ion battery cells, nickel-hydrogen battery cells, lead battery cells, for example. In this description hereinafter, an example is assumed where lithium-ion battery cells (nominal voltage: 3.6 to 3.7 V) are used.

Cells E1 through En composing battery module M1 are connected in series with shunt resistance Rs, which functions as a current detection element. Instead of shunt resistance Rs, a Hall effect sensor may be used. Besides, to detect the temperature of cells E1 through En, temperature sensors T1 and T2 are provided. Either one or more temperature sensors may be placed on battery module M1. Temperature sensors T1 and T2 can be thermistors.

The path between each node of series-connected cells E1 through En and voltage measurement unit 21 is connected through a voltage line. Voltage measurement unit 21 measures respective voltages between adjacent two voltage lines to obtain respective voltages of cells E1 through En. Voltage measurement unit 21 transmits the respective voltages to control unit 24 through a communication line.

Voltage measurement unit 21 is higher in voltage than control unit 24, and thus the path between voltage measurement unit 21 and control unit 24 is connected through a communication line in an insulated state as required. Voltage measurement unit 21 can be composed of an ASIC (application specific integrated circuit) or a general-purpose analog front end IC. Voltage measurement unit 21 includes a multiplexer and an A/D converter. The multiplexer outputs voltages between adjacent two voltage lines to the A/D converter in order from the highest. The A/D converter converts an analog voltage input from the multiplexer to a digital value.

Temperature measurement unit 22 includes voltage divider resistances and an A/D converter. The A/D converter successively converts analog voltages voltage-divided by temperature sensors T1 and T2 and the voltage divider resistances to digital values and outputs the results to control unit 24. Control unit 24 estimates the temperature of cells E1 through En based on the digital values.

Current measurement unit 23 includes a differential amplifier and an A/D converter. The differential amplifier amplifies the voltage across shunt resistance Rs and outputs the result to the A/D converter. The A/D converter converts an analog voltage input from the differential amplifier to a digital value and outputs the result to control unit 24. Control unit 24 estimates a current flowing through cells E1 through En based on the digital value.

Here, if control unit 24 incorporates an A/D converter and has an analog input port, the following operation may be performed. That is, temperature measurement unit 22 and current measurement unit 23 output an analog voltage to control unit 24, and the A/D converter inside control unit 24 converts the analog voltage to a digital value.

Control unit 24 manages the state of cells E1 through En based on voltages, temperature, and currents of cells E1 through En measured by voltage measurement unit 21, temperature measurement unit 22, and current measurement unit 23. Control unit 24 can be composed of a microprocessor and nonvolatile memory (e.g., EEPROM (electrically erasable programmable read-only memory), flash memory).

The inside of the internal memory of the microprocessor retains SOC (state of charge)-OCV (open circuit voltage) map 241. SOC-OCV map 241 has a description of the characteristics data of the SOC-OCV curve of cells E1 through En. The SOC-OCV curve of cells E1 through En is created in advance by a battery manufacturer based on a characteristics test by the manufacturer and is registered into the internal memory of the microprocessor before shipment. Here, SOC-OCV map 241 may be registered into nonvolatile memory. To estimate the SOC or OCV of cells E1 through En with a higher degree of accuracy, the battery manufacturer may derive the SOC-OCV characteristics of cells E1 through En for every combination of the temperature segment and deterioration level (SOH: state of health) segment for mapping. Here, instead of a map, a function may be used with an SOC as an objective variable, and OCV, temperature, and a deterioration level as description variables.

Control unit 24 can estimate an SOC and an SOH of each of cells E1 through En. Control unit 24 can estimate an SOC by the OCV method or current integration method. The OCV method estimates an SOC based on the OCV of each of cells E1 through En measured by voltage measurement unit 21 and the characteristics data of the SOC-OCV curve described in SOC-OCV map 241. Here, OCV at a future moment is estimated based on voltage of each of cells E1 through En measured by voltage measurement unit 21, a current of battery module M1 measured by current measurement unit 23, and the temperature of battery module M1 measured by temperature measurement unit 22. The current integration method estimates an SOC based on the OCV of each of cells E1 through En when each of cells E1 through En starts charging or discharging and on an integrated value of currents measured by current measurement unit 23. In the current integration method, longer charging/discharging time causes the measurement error of current measurement unit 23 to accumulate. Therefore, it is preferable to correct an SOC estimated by the current integration method using an SOC estimated by the OCV method.

An SOH is defined by the ratio of the present fully charged capacity to the initial fully charged capacity, where a lower value (closer to 0%) indicates a higher deterioration. An SOH may be determined by measuring the capacity through complete charge-discharge or by totaling preservation deterioration and cycle deterioration. Preservation deterioration can be estimated based on an SOC, temperature, and the rate of preservation deterioration. Cycle deterioration can be estimated based on an SOC range to be used, temperature, a current rate, and the rate of cycle deterioration. The rate of preservation deterioration and the rate of cycle deterioration can be derived in advance by an experiment or simulation. An SOC, temperature, an SOC range, and a current rate can be determined by measurement.

An SOH can be also estimated based on the mutual relationship between internal resistances of the cells. An internal resistance can be estimated by dividing a voltage drop generated when a cell is fed with a given current for a given time by the current value. An internal resistance becomes lower at a higher temperature, and becomes higher with a lower SOH.

Control unit 24 periodically transmits monitoring data to management unit 30, where the monitoring data includes at least one of voltage, temperature, current, SOC, SOH, and the internal resistance of cells E1 through En contained in battery pack 20. For communication between control unit 24 and management unit 30 of battery pack 20, a serial communication compliant with the RS-485 standard can be used for example. The path between control unit 24 and management unit 30 of battery pack 20 may be connected through a dedicated communication line, wirelessly, or through a power line communication.

Figure 3:
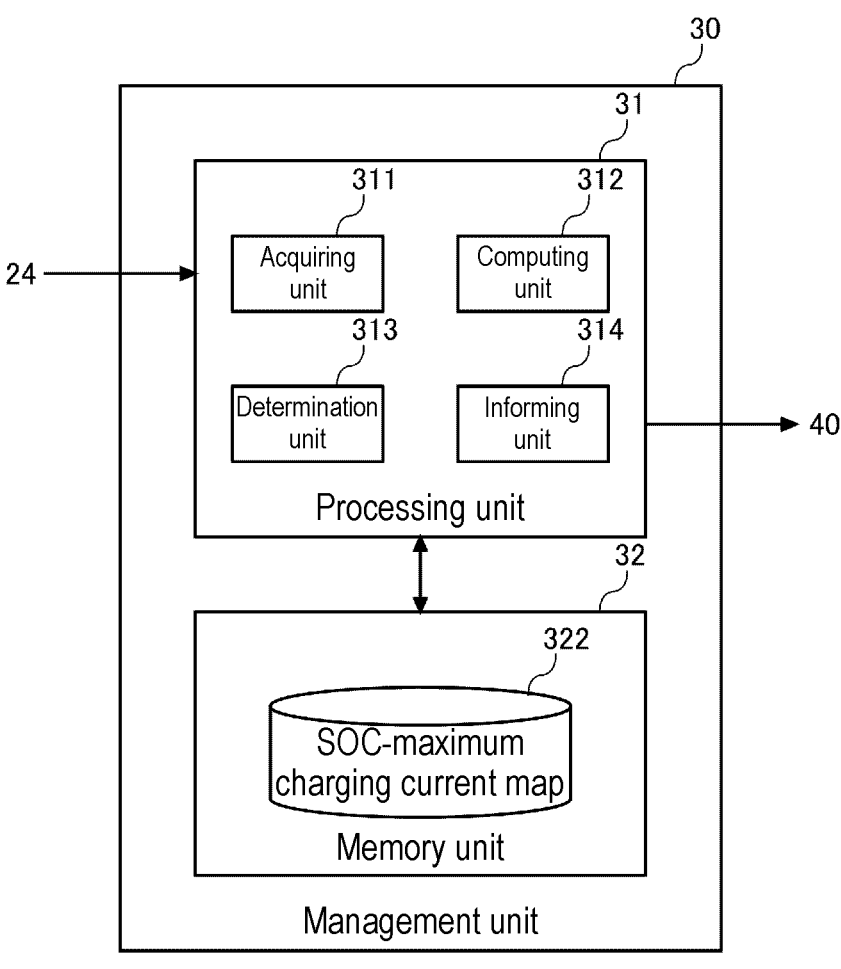
FIG. 3 shows an example internal configuration of the management unit in FIG. 1.

FIG. 3 shows an example internal configuration of management unit 30 in FIG. 1. Management unit 30, which includes processing unit 31 and memory unit 32, manages battery packs 20a through 20c.

Processing unit 31 includes acquiring unit 311, computing unit 312, determination unit 313, and informing unit 314. The functions of processing unit 31 can be implemented by the cooperation of hardware resources and software resources, or only by hardware resources. The hardware resources include a CPU, ROM, RAM, DSP, ASIC, FPGA, and other LSIs. The software resources include programs such as those of firmware.

Memory unit 32 includes a nonvolatile recording medium such as flash memory. Memory unit 32 holds SOC-maximum charging current map 322. SOC-maximum charging current map 322 has a description of the characteristics data of an SOC-maximum charging current curve of cells E1 through En. The curve is created based on a characteristics test by the battery manufacturer. The curve is characteristics data that defines a maximum charging current allowed to charge a cell for each SOC from the aspect of the protection and safety of the cell. In a typical cell, a higher SOC results in a lower maximum current allowed to charge. In this description, a charging current is assumed to be an absolute value.

When a cell is discharged, a higher discharging current results in a lower CCV (closed circuit voltage). The CCV of a discharging cell is defined by following expression 1. When a cell is charged, a higher charging current results in a higher CCV. The CCV of a charging cell is defined by following expression 2.

$$CCVd = OCV - Id \times R \qquad \text{(expression 1)}$$

$$CCVc = OCV + Ic \times R, \qquad \text{(expression 2)}$$

where Id is a discharging current, Ic is a charging current, and R is an internal resistance.

As shown by expression 2 above, higher charging current Ic results in a higher CCV. The CCV in an overcharging region increases a burden to the battery, resulting in a factor of deterioration. As shown in expression 2 above, a higher OCV results in a higher CCV. A higher SOC results in a higher OCV, and thus a higher SOC requires the maximum value of charging current Ic to be specified lower.

The SOC-maximum charging current characteristics of cells E1 through En vary depending on temperature and a deterioration level (SOH). The battery manufacturer derives the SOC-OCV characteristics of cells E1 through En for every combination of the temperature segment and deterioration level segment for mapping. The SOC-maximum charging current characteristics are registered into control unit 24 (e.g., into the internal memory of the microprocessor) of battery pack 20 before shipment. Management unit 30 of electromotive vehicle 1 acquires the SOC-maximum charging current characteristics from control unit 24 of battery pack 20 when relevant battery pack 20 is first attached to electromotive vehicle 1. Here, instead of the SOC-maximum charging current characteristics, the SOC-maximum charge power characteristics or both may be used. For example, the following operation may be executed. That is, the maximum value of charging current from charger 2 is controlled in reference to the SOC-maximum charging current characteristics, and the maximum value of regenerative power from motor 60 is controlled in reference to the SOC-maximum charge power characteristics. Also, instead of a map, a function may be used with a maximum charging current or maximum charge power as its objective variable and with an SOC, temperature, and deterioration level as its description variables.

Figure 4:
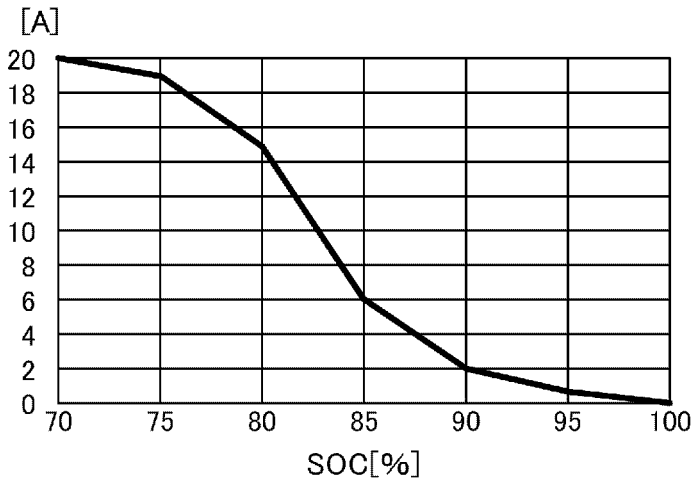
FIG. 4 shows an example of the SOC-maximum charging current characteristics of a battery pack at 0° C.

FIG. 4 shows an example of the SOC-maximum charging current characteristics of a battery pack at 0° C. As shown in FIG. 4, a higher SOC results in a lower maximum charging current.

Referring to FIG. 3 again, acquiring unit 311 acquires monitoring data that includes at least voltage and an SOC of cells E through En from control unit 24 of each battery pack 20. Computing unit 312 estimates an SOC of each of battery packs 20 based on the SOC of cells E through En contained in each battery pack 20. Usually, the lowest SOC of a cell is assumed to be the SOC of the pack for a low SOC; the highest, for a high SOC. Here, the following operation may be executed. That is, computing unit 312 converts the SOC of cells E through En contained in battery pack 20 to a capacity to calculate a combined capacity of relevant cells E to En, and the SOC corresponding to the relevant combined capacity is assumed to be the SOC of the pack.

In this embodiment, as described above, the following state occurs. That is, pack relays RY1 connected to some battery packs 20 in battery packs through 20c are on and pack relays RY1 connected to the remaining battery packs 20 are off. When one of the pack relays RY1 in the off state (hereinafter, referred to as target pack relay RY1) should be turned on, computing unit 312 estimates a maximum current or power allowed to charge entire battery packs (hereinafter, referred to as a parallel system) when relevant target pack relay RY1 is turned on.

Determination unit 313 compares a maximum value (hereinafter, referred to as a maximum predicted value) estimated by computing unit 312 with a threshold based on a maximum value (hereinafter, referred to as a maximum present value) of current or power allowed to charge the parallel system before target pack relay RY1 is turned on. The relevant threshold may be the same value (adjustment value $\alpha=0$) as the maximum present value, the maximum present value plus adjustment value $\alpha$, or the maximum present value minus adjustment value $\alpha$. Designers can set adjustment value $\alpha$ in consideration of the number of parallel-connected battery packs 20 and applications for example. Determination unit 313 permits target pack relay RY1 to be turned on for the maximum predicted value higher than the relevant threshold; does not, lower. Relay drive unit 25 turns on target pack relay RY1 when determination unit 313 permits target pack relay RY1 to be turned on.

Informing unit 314 informs vehicle ECU 40 of a maximum value (hereinafter, referred to as a maximum value of current or power allowed to charge the entire parallel system, where both are collectively called a maximum value of charging). The path between management unit 30 and vehicle ECU 40 is connected through a vehicle-mounted network. Examples of a vehicle-mounted network include CAN (controller area network) and LIN (local interconnect network). Vehicle ECU 40 controls regenerative current or regenerative power by motor 60 within the range of the maximum charging current value or maximum charging power value of the entire parallel system received from management unit 30. When the value of regenerative power by the regenerative brake reaches the maximum charging power value of the entire parallel system for example, vehicle ECU 40 switches from the regenerative brake to the mechanical brake. The mechanical brake converts regenerative energy to thermal energy. When charger 2 fast-charges with DC, informing unit 314 informs charger 2 of the maximum charging current value or maximum charging power value of the entire parallel system.

Basically, a larger number of parallel-connected battery packs 20 results in a larger maximum charging value of the entire parallel system. Even if battery pack 20 is added to the parallel system, however, the maximum charging value of the entire parallel system does not increase in a certain case. That is when unconnected battery pack 20 is connected to generate a cross current between battery packs 20.

Figure 5:
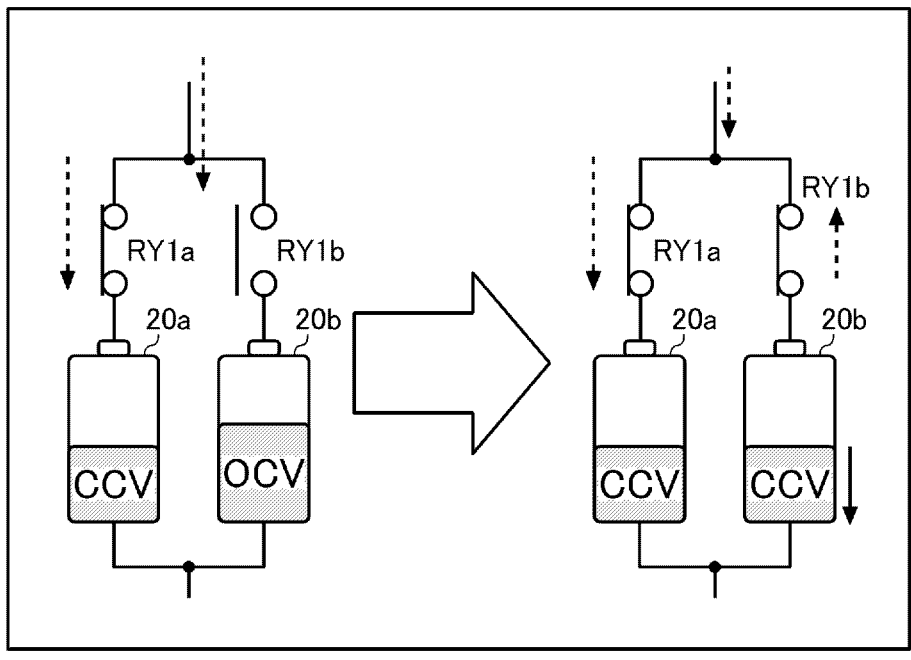
FIG. 5 illustrates a cross current between battery packs.

FIG. 5 illustrates a cross current between battery packs 20. To be easily understood, FIG. 5 shows two parallel-connected battery packs 20. The left figure shows a state where first pack relay RY1 connected to first battery pack 20a is on, second pack relay RY1 connected to second battery pack 20b is off, and a current is being supplied from a power supply (e.g., charger 2) only to first battery pack 20a. In this case, the maximum charging current value of the entire parallel system is equal to that of first battery pack 20a.

The right figure of FIG. 5 shows a state after second pack relay RY1 is turned on. If the OCV of second battery pack 20b is higher than the CCV when first battery pack 20a is charged with the maximum charging current value, a cross current occurs from second battery pack 20b to first battery pack 20a. Although this does not change the maximum charging current value of first battery pack 20a, a current allowed to charge from the power supply to first battery pack 20a decreases, reducing the maximum charging current value of the entire parallel system viewed from the power supply. While charger 2 is charging with the maximum current, control operation inside charger 2 can stop charging.

The CCV when first battery pack 20a is charged with the maximum charging current value is an estimated value. A current charged to first battery pack 20a fluctuates due to the fluctuation of power supply voltage for example, under the influence of which the CCV of first battery pack 20a fluctuates, too. The CCV when first battery pack 20a is charged with the maximum charging current value indicates the maximum voltage while first battery pack 20a is charged.

Next a consideration is made for the following. That is, in a case where the CCV when first battery pack 20a is charged with the maximum charging current value is equal to the OCV of second battery pack 20b, second pack relay RY1 is turned on. If current actually charging first battery pack 20a from the power supply is equal to the maximum charging current value of first battery pack 20a, the CCV of first battery pack 20a becomes equal to the OCV of second battery pack 20b. In this case, a cross current does not occur between first battery pack 20a and second battery pack 20b, and the maximum charging current value of the entire parallel system decreases.

If current actually charging first battery pack 20a from the power supply is lower than the maximum charging current value of first battery pack 20a, the actual CCV of first battery pack 20a is lower than the CCV when charging with the maximum charging current value. In this case, a cross current occurs from second battery pack 20b to first battery pack 20a. However, if an output current from the power supply rises to the maximum charging current value of first battery pack 20a, a cross current stops, and thus the maximum charging current value of the entire parallel system does not decrease.

Next a consideration is made for the following. That is, in a case where the OCV of second battery pack 20b is lower than the CCV when first battery pack 20a is charged with the maximum charging current value, second pack relay RY1 is turned on. The maximum charging current value of second battery pack 20*b* is higher than that of first battery pack 20*a*, and thus the maximum charging current value of the entire parallel system does not decrease when second pack relay RY1 is turned on.

The above description illustrates an example where computing unit 312 of management unit 30 calculates both the maximum charging current value of each battery pack 20 and the maximum charging current value of the entire parallel system. Here, the maximum charging current value of battery pack 20 may be calculated by control unit 24 inside battery pack 20. Control unit 24 inside each battery pack 20 transmits the maximum charging current value of battery pack 20 calculated to management unit 30. Computing unit 312 of management unit 30 calculates a maximum charging current value of the entire parallel system based on each maximum charging current value received from battery packs 20.

Hereinafter, two exemplary embodiments are described of the determination process that determines whether or not parallel connection of target pack relays RY1 is permitted. The first embodiment describes a dynamic determination process; the second, static.

Figure 6:
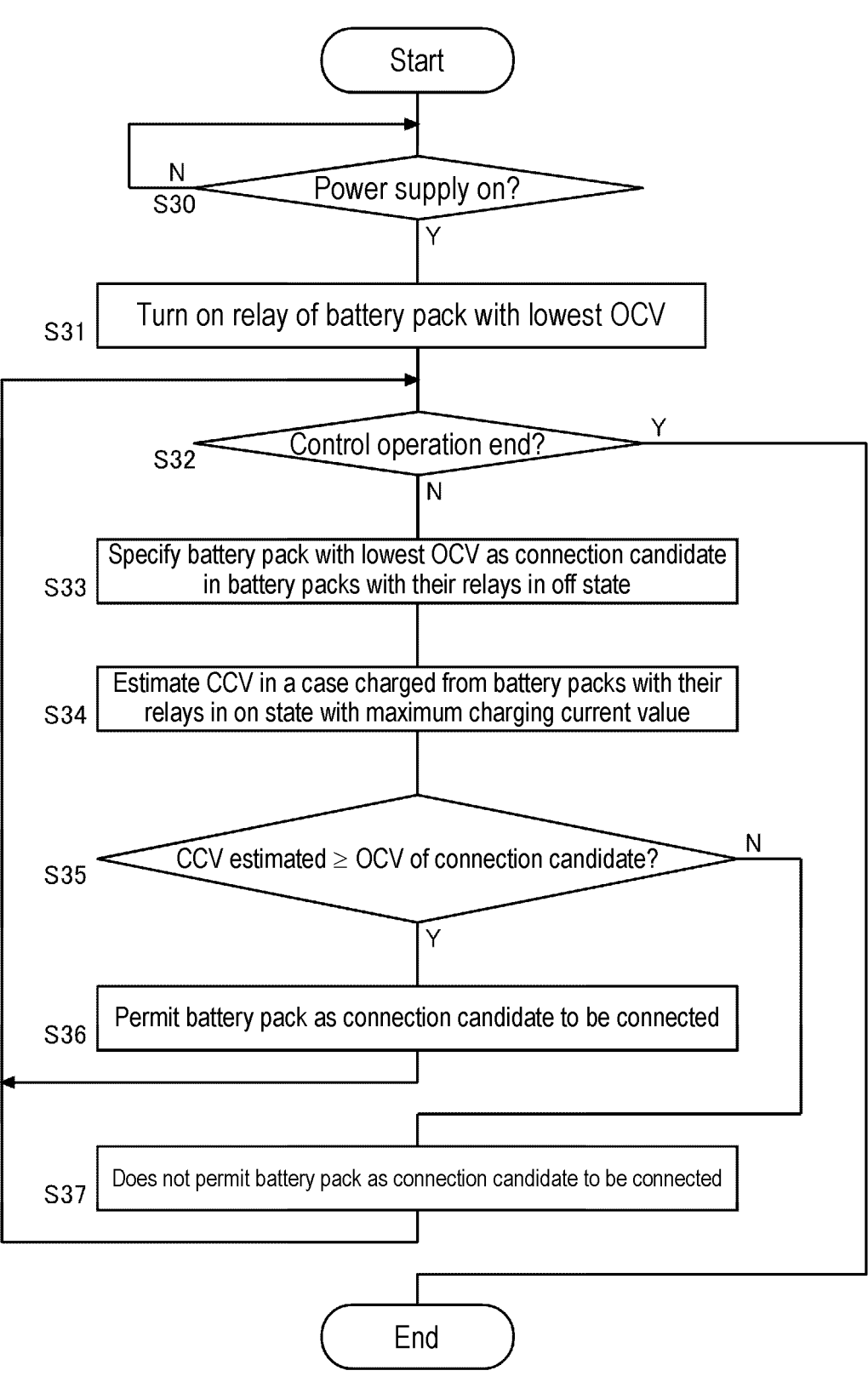
FIG. 6 is a flowchart for illustrating the determination process in parallel connection according to the first exemplary embodiment.

FIG. 6 is a flowchart for illustrating the determination process in parallel connection according to the first embodiment. When the power supply of electromotive vehicle 1 is turned on (corresponding to turning on of the ignition of an engine vehicle) (Y in S30), determination unit 313 makes relay drive unit 25 turn on pack relay RY1 connected to battery pack 20 with the lowest OCV in battery packs 20 (S31). If there are two or more such battery packs 20, determination unit 313 makes relay drive unit 25 simultaneously turn on pack relays RY1 connected to relevant battery packs 20.

During the execution of the parallel-connection control (N in S32), the following process is executed. Determination unit 313 specifies battery pack 20 with the lowest OCV in battery packs 20 with their pack relays RY1 in the off state as a connection candidate that should be turned on next (S33).

Computing unit 312 derives a maximum charging current value of relevant battery pack 20 based on the SOC of battery pack 20 with its pack relay RY1 in the on state in reference to SOC-maximum charging current map 322. Computing unit 312 applies the OCV, internal resistance, and maximum charging current value of relevant battery pack 20 to the above expression 2 to estimate CCV corresponding to the maximum charging current value of relevant battery pack 20 (S34). Here, in deriving an SOC, internal resistance, and maximum charging current value of relevant battery pack 20, computing unit 312 takes at least temperature and the SOH of relevant battery pack 20 in consideration as parameters.

Determination unit 313 compares the CCV estimated with the OCV of battery pack 20 as a connection candidate (S35). If the CCV estimated is equal to or higher than the OCV of battery pack 20 as a connection candidate (Y in S35), determination unit 313 permits battery pack 20 as a connection candidate to be connected (S36) and makes relay drive unit 25 turn on pack relay RY1 connected to battery pack 20 as a connection candidate. If the CCV estimated is lower than the OCV of battery pack 20 as a connection candidate (N in S35), determination unit 313 does not permit battery pack 20 as a connection candidate to be connected (S37). The process flow proceeds to step S32.

Here, if there are two or more battery packs 20 with their pack relays RY1 in the on state, the CCVs corresponding to the maximum charging current value of relevant battery packs 20 are equal to each other. In such a state, computing unit 312 estimates a CCV corresponding to the maximum charging current value of battery packs 20 in the on state.

In the determination of step S35, if the CCV estimated is lower than the OCV of battery pack 20 as a connection candidate, relevant battery pack 20 cannot be connected. However, if battery pack 20 in the on state continues to be charged, the SOC of the battery pack 20 rises. As the SOC rises, the OVC rises as well as the CCV corresponding to the maximum charging current value. When the CCV corresponding to the maximum charging current value rises to the OCV of battery pack 20 as a connection candidate, relevant battery pack 20 can be connected. Here, temperature change can increase the CCV corresponding to the maximum charging current value.

Next, a description is made of the determination process in parallel connection according to the second embodiment. As described above, if the OCVs between parallel-connected battery packs 20 are not equal to each other, a cross current occurs from battery pack 20 with a high OCV to that with a low OCV. The cross current causes the OCV of battery pack 20 with a high OCV to decrease; low, to increase. When the voltage difference between them becomes zero, the cross current stops. In a stop state of the cross current, the OCVs between parallel-connected battery packs 20 are equal to each other.

Figure 7:
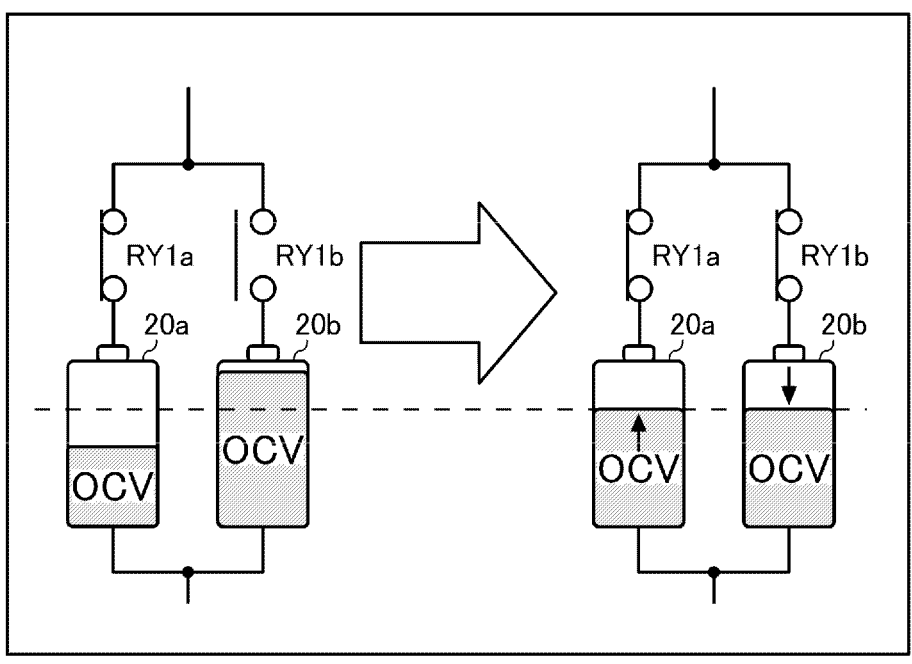
FIG. 7 illustrates a cross current between battery packs and the convergence of OCVs.

FIG. 7 illustrates a cross current between battery packs 20 and the convergence of OCVs. To be easily understood, FIG. 7 shows two parallel-connected battery packs 20. The left figure shows a state where first pack relay RY1 connected to first battery pack 20*a* is on, second pack relay RY1 connected to second battery pack 20*b* is off, and the OCV of first battery pack 20*a* is lower than the OCV of second battery pack 20*b*.

The right figure of FIG. 7 shows a state after second pack relay RY1 is turned on. When there is conduction between first battery pack 20*a* and second battery pack 20*b*, a current flows from second battery pack 20*b* to first battery pack 20*a*, the OCV of second battery pack 20*b* decreases, and the OCV of first battery pack 20*a* rises. When they become equal soon, a cross current from second battery pack 20*b* to first battery pack 20*a* stops.

The OCVs of first battery pack 20*a* and second battery pack 20*b* in a stopped state of a cross current are the average SOC of the SOC of first battery pack 20*a* and that of second battery pack 20*b* before a cross current occurs, and the OCV in a stopped state of a cross current is the OVC corresponding to the relevant average SOC, under ideal conditions (e.g., equal pack capacities). Here, even if three or more battery packs 20 with different OCVs are parallel connected, the OVCs of relevant battery packs 20 become equal under ideal conditions. In such a case, the OVCs of relevant three or more battery packs 20 after becoming equal result in an average value of the OCVs of relevant three or more battery packs 20 before a cross current occurs.

In the second embodiment, computing unit 312 estimates a maximum charging current value of the entire parallel system when the OCVs converge after unconnected battery pack 20 is connected to the parallel system. Determination unit 313, when the maximum charging current value estimated is equal to or higher than that of the entire parallel system before unconnected battery pack 20 is connected to the parallel system, permits relevant unconnected battery pack 20 to be connected. Determination unit 313, when the maximum charging current value estimated is lower than that of the entire parallel system before unconnected battery pack 20 is connected to the parallel system, does not permit relevant unconnected battery pack 20 to be connected.

Figure 8:
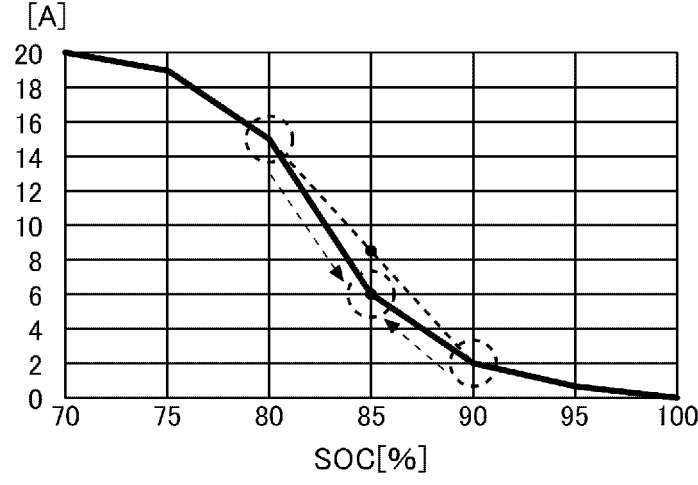
FIG. 8 illustrates an example of changes in the maximum discharging power value of the entire parallel system before and after an unconnected battery pack is connected.

FIG. 8 illustrates an example of changes in the maximum discharging power value of the entire parallel system before and after unconnected battery pack 20 is connected. A consideration is made for an example where first battery pack 20*a* is connected to the power supply, and second battery pack 20*b* is not connected to the power supply as the state shown in the left figure of FIG. 7. Hereinafter, a description is made on the assumption that a battery pack composed of the same type of cells is used, and conditions related to the pack capacity, SOH, and temperature are same. It is assumed that the SOC of first battery pack 20*a* is 80% and the SOC of second battery pack 20*b* is 90%. In reference to the SOC-maximum charging current characteristics shown in FIG. 8, the maximum charging current value for an SOC of 80% is 15 A. In the same way, the maximum charging current value of the entire parallel system with only first battery pack 20*a* connected is also 15 A.

Next, a consideration is made of a state after second battery pack 20*b* is connected to the parallel system as shown in the right figure of FIG. 7. When second battery pack 20*b* is connected to the parallel system, a cross current occurs from second battery pack 20*b* to first battery pack 20*a*. The cross current causes the SOC of second battery pack 20*b* to decrease and the SOC of first battery pack 20*a* to rise. When both the SOCs reach 85%, the cross current stops. In reference to the SOC-maximum charging current characteristics shown in FIG. 8, the maximum charging current value for an SOC of 85% is 6 A. Thus, the maximum charging current value of the entire parallel system is 12 A (=6 A×2) in a state where first battery pack 20*a* and second battery pack 20*b* are connected.

In this example, connecting second battery pack 20*b* causes the maximum charging current value of the entire parallel system to decrease from 15 A to 12 A. As shown in FIG. 8, if the maximum charging current value in a state of equal SOCs (SOC=85%) is under the virtual line that is a straight line between the maximum charging current value (15 A) of first battery pack 20*a* before second battery pack 20*b* is connected and the maximum charging current value (2 A) of second battery pack 20*b*, the maximum charging current value of the entire parallel system is lower than a current value derived by simply averaging the maximum charging current value (15 A) of first battery pack 20*a* before being connected and the maximum charging current value (2 A) of second battery pack 20*b*. Consequently, if the maximum charging current value of the entire parallel system after second battery pack 20*b* is connected without referring to the SOC-maximum charging current characteristics, the maximum charging current value can be excessively estimated, possibly resulting in the actual maximum charging current value lower than the charging current value from charger 2.

FIG. 9 is a flowchart for illustrating the determination process in parallel connection according to the second embodiment. When the power supply of electromotive vehicle 1 is turned on (Y in S40), determination unit 313 makes relay drive unit 25 turn on pack relay RY1 connected to battery pack 20 with the lowest OCV in battery packs 20 (S41). If there are two or more such battery packs 20, determination unit 313 makes relay drive unit 25 simultaneously turn on pack relays RY1 connected to relevant battery packs 20.

During the execution of the parallel-connection control (N in S42), the following process is executed if there is at least one battery pack 20 with its pack relay RY1 in the off state.

Determination unit 313 specifies battery pack with the lowest OCV as a connection candidate that should be turned on next in battery packs with their pack relays RY1 in the off state (S43).

Computing unit 312 estimates a convergence value of the OCVs of battery packs 20 connected to the parallel system when battery pack 20 as a connection candidate is turned on (S44). Computing unit 312 derives a maximum charging current value of one battery pack 20 based on the SOC corresponding to the OCV that has converged in reference to SOC-maximum charging current map 322. Computing unit 312 multiplies the maximum charging current value of one battery pack 20 by the number of parallel-connected battery packs 20 to estimate a maximum charging current value of the entire parallel system (S45). In deriving an SOC and a maximum charging current value of battery pack 20, computing unit 312 takes at least temperature and an SOH of relevant battery pack 20 in consideration as parameters.

Determination unit 313 determines whether or not the maximum charging current value of the entire parallel system decreases due to the connection of battery pack 20 as a connection candidate (S46). If the maximum charging current value of the entire parallel system does not decrease (N in S46), determination unit 313 permits battery pack 20 as a connection candidate to be connected (S47) and makes relay drive unit 25 turn on pack relay RY1 connected to battery pack 20 as a connection candidate. If the maximum charging current value decreases (Y in S46), determination unit 313 does not permit battery pack 20 as a connection candidate to be connected (S48). The process flow proceeds to step S42.

In the determination of step S46, if the maximum charging current value of the entire parallel system decreases due to the connection of battery pack 20 as a connection candidate, battery pack 20 as a connection candidate cannot be connected. However, if battery pack 20 in the on state continues to be charged, its SOC rises. As the SOC rises, the maximum charging current value of the entire parallel system also rises. Eventually, such a state is entered that the maximum charging current value of the entire parallel system does not decrease even if battery pack 20 as a connection candidate is connected. Besides, temperature change can cause the maximum charging current value of the entire parallel system to decrease.

As described above, the embodiment prohibits unconnected battery pack 20 to be connected when the maximum value of charging the entire parallel system decreases due to the connection of unconnected battery pack 20. This prevents increasing charging time and wasting regenerative energy, which prevents the charging efficiency of battery pack 20 from decreasing.

Hereinbefore, the present disclosure has been described based on the embodiments. These embodiments are merely exemplary, and it is understood by those skilled in the art that various modifications to the combination of each component and each process in the embodiments are possible and that such modifications are also within the scope of the present disclosure.

The determination process in parallel connection according to the first embodiment and that to the second may be used together. In this case, if both determination processes permit connection, battery pack 20 as a connection candidate is connected. If at least one of the determination processes does not permit connection, battery pack 20 as a connection candidate is not connected. For example, even if the determination process according to the second embodiment permits connection, that according to the first embodiment sometimes does not permit.

The determination process according to the second embodiment determines whether or not battery pack 20 as a connection candidate can be connected based on a maximum charging value of the entire parallel system at a certain time point in the future; however, consideration is not made of a maximum charging value during the course until the time point. Meanwhile, the determination process according to the first embodiment determines whether or not battery pack 20 as a connection candidate can be connected based on a maximum charging value at the present moment changing from moment to moment. Thus, both determination results can disagree with each other. If the determination process in parallel connection according to the first embodiment and that according to the second are used together, it further prevents the charging efficiency from decreasing.

The above embodiment describes an example where management unit is placed outside battery packs 20. Here, management unit 30 may be placed inside one of battery packs 20. In such a case, battery pack 20 that implements the function of management unit 30 is a master machine; remaining battery packs 20 are slave machines.

The above embodiment describes an example where detachable, interchangeable battery packs 20 are parallel connected. Here, stationary battery packs 20 may be parallel connected. Stationary battery packs 20 allow the unification of the functions of two or more control units 24 and management units 30 each provided on battery packs 20. For example, two or more control units 24 and management units 30 may be implemented by one microprocessor.

The above embodiment describes an example where battery packs 20 incorporating battery modules M1 are used including lithium-ion battery cells, nickel-hydrogen battery cells, and lead battery cells. Here, a capacitor pack may be used including electric double layer capacitor cells and lithium-ion capacitor cells. In this description, a battery module and a capacitor module are collectively called a power storage module, and a battery pack and a capacitor pack are collectively called a power storage pack.

The above embodiment describes an example where detachable, interchangeable power storage packs are parallel connected. Here, the present disclosure is also applicable to a determination process in parallel connection of power storage modules inside one power storage pack. Here, the above embodiment assumes an example of one power storage module provided in one power storage pack, and thus the determination process in parallel connection of power storage packs is synonymous with that of power storage modules.

A mobile object with interchangeable battery pack 20 as its power supply is not limited to electromotive vehicle 1, but includes an electromotive ship. For example, a water bus and a water taxi may use interchangeable battery pack 20 as their power supply. Battery pack 20 may be one that supplies power to an outboard motor. The mobile object can be a train. For example, instead of a diesel railcar used in an unelectrified line, a train incorporating interchangeable battery pack 20 can be used. The mobile object can be an electromotive flying object such as a multicopter (drone). The multicopter can be what is called a flying automobile.

The embodiments may be specified by the following items.

[Item 1] A management device (30) that manages two or more power storage modules (M1) each parallel-connected to a power supply (60, 2) through a switch (RY1), the management device (30) including a determination unit (313) that works as follows. That is, in a state where switches (RY1) connected to some of the power storage modules (M1) are on; and switches (RY1) connected to the remaining power storage modules (M1) are off, when at least one of the off-state switches (RY1) are turned on, the determination unit (313) does not permit the relevant switch (RY1) to be turned on when a maximum value of current or power allowed to charge all of the power storage modules (M1) is lower than a threshold based on the maximum value before the relevant switch (RY1) is turned on, if the relevant switch (RY1) is turned on.

This prevents decreasing the efficiency of charging all the power storage modules (M1) from the power supply (60, 2) due to an unconnected power storage module (M1) connected.

[Item 2] The management device (30) described in item 1, further including an acquiring unit (311) that acquires at least an SOC (state of charge) of each of the power storage modules (M1) and a computing unit (312) that estimates a maximum value of current or power allowed to charge all of the power storage modules (M1) based on SOC-maximum charge characteristics defining relationship between an SOC of the power storage module (M1) and a maximum value of current or power allowed to charge the power storage module (M1), where the SOC-maximum charge characteristics represent that a higher SOC of the power storage module (M1) results in a lower maximum value of current or power allowed to charge the relevant power storage module (M1).

This allows a maximum value of current or power allowed to charge two or more power storage modules (M1) to be specified highly accurately.

[Item 3] The management device (30) described in item 2, where the acquiring unit (311) acquires OCV (open circuit voltage) of a power storage module (M1) as a connection candidate in the remaining power storage modules (M1), the computing unit (312), based on the SOC-maximum charge characteristics and an SOC (state of charge) of a power storage module (M1) connected to the power supply (60, 2), derives a maximum value of current or power allowed to charge the relevant power storage module (M1), and estimates CCV (closed circuit voltage) of the relevant power storage module (M1) if the relevant power storage module (M1) is charged with the relevant maximum value, and the determination unit (313) does not permit a switch (RY1) connected to the power storage module (M1) as a connection candidate to be turned on when OCV of the power storage module (M1) as a connection candidate is higher than the CCV.

This allows whether or not the efficiency of charging all of the power storage modules (M1) from the power supply (60, 2) decreases to be dynamically determined.

[Item 4] The management device (30) described in item 2 or 3, where the computing unit (312), based on the SOC-maximum charge characteristics, corresponding to OCV of a power storage module (M1) connected to the power supply (60, 2), and an SOC corresponding to OCV of a power storage module (M1) as a connection candidate, estimates a maximum value of current or power allowed to charge all of the power storage modules (M1) when OCV of the power storage module (M1) connected to the power supply (60, 2) corresponds with OCV of the power storage module (M1) as a connection candidate, after a switch (RY1) connected to the power storage module (M1) as a connection candidate is turned on, and the determination unit (313) does not permit the switch (RY1) to be turned on when the maximum value estimated is lower than the maximum value before the switch (RY1) is turned on.

This allows whether or not the efficiency of charging all of the power storage modules (M1) from the power supply (60, 2) decreases to be statically predicted.

[Item 5] The management device (30) described in any one of items 1 through 4, where a switch (RY1) connected to a power storage module (M1) with the lowest OCV in the power storage modules (M1) is turned on when power from the power supply (60, 2) to power storage modules (M1) starts being supplied, and a power storage module (M1) with the lowest OCV in power storage modules (M1) with their switches (RY1) in an off state becomes a connection candidate the switch (RY1) of which should be turned on next.

This prevents decreasing the efficiency of charging all the power storage modules (M1) from the power supply (60, 2) and allows power storage modules (M1) to be parallel connected.

[Item 6] A power supply system (10) including two or more power storage modules (M1) each parallel-connected to a power supply (60, 2) through a switch (RY1), and the management device (30) described in any one of items 1 through 5.

This implements a power supply system (10) that prevents decreasing the efficiency of charging all the power storage modules (M1) from the power supply (60, 2) due to an unconnected storage module (M1) connected.

[Item 7] The power supply system (10) described in item 6, where a power supply (60, 2) is a motor (60) of a mobile object (1) or an external charger (2), and the management device (30) informs a control unit (40) inside the mobile object (1) of a maximum value of current or power allowed to regenerate power from the motor (60) to all of the power storage modules (M1).

This prevents regenerative energy generated by a motor (60) from being wasted.

REFERENCE MARKS IN THE DRAWINGS

1 Electromotive vehicle
2 Charger
3 Series
5 Charging cable
10 Power supply system
20 Battery pack
30 Management unit
M1 Battery module
E1-En Cell
21 Voltage measurement unit
22 Temperature measurement unit
23 Current measurement unit
24 Control unit
241 SOC-OCV map
25 Relay drive unit
31 Processing unit
311 Acquiring unit
312 Computing unit 313 Determination unit
314 Informing unit
32 Memory unit
322 SOC-maximum charging current map
40 Vehicle ECU
50 Inverter
60 Motor
70 AC/DC converter
RYc Main relay
RY1 Pack relay
Rs Shunt resistance
T1, T2 Temperature sensor

The invention claimed is:

1. A management device that manages a plurality of power storage modules parallel-connected to a power supply through a plurality of switches including a first switch and at least one second switch, comprising:

a processor configured to:

in a state where the first switch connected to a part of the plurality of power storage modules is in an on state and the at least one second switch connected to a remaining one or more of the plurality of power storage modules is in an off state, acquire, before the at least one second switch is turned on, a current state of charge (SOC) of each of the power storage modules, determine a first maximum value of current or power allowed to charge the part of the plurality of power storage modules before the at least one second switch is turned on by using the current SOC of each of the plurality of power storage modules connected through the first switch, determine a second maximum value of current or power allowed to charge all of the power storage modules by using the current SOC of each of the plurality of power storage modules connected through the first switch, assuming that the at least one second switch is turned on, and prevent the at least one second switch from being turned on when the second maximum value is lower than a threshold based on the first maximum value.

2. The management device of claim 1, wherein the first switch is connected to a power storage module with a lowest open circuit voltage among the plurality of power storage modules and is turned on when power from the power supply starts being supplied to the plurality of power storage modules, and the at least one second switch is connected to a power storage module with a lowest open circuit voltage among the plurality of power storage modules connected to switches in an off state.

3. A power supply system comprising:

the management device of claim 1; and the plurality of power storage modules parallel-connected to the power supply through the plurality of switches including the first switch and the at least one second switch.

4. The power supply system of claim 3, wherein the power supply is a motor of a mobile object or an external charger, and when the power supply is the motor, the processor is configured to inform a control unit inside the mobile object of the second maximum value of current or power allowed to regenerate power from the motor to all of the power storage modules.

5. The management device of claim 1, wherein the processor is further configured to:

determine the first maximum value and the second maximum value based on SOC-maximum charge characteristics defining a relationship between the current SOC of each of the plurality of power storage modules and a third maximum value of current or power allowed to charge each of the power storage modules, wherein the third maximum value is lower when the current SOC of each of the plurality of power storage modules is higher in the SOC-maximum charge characteristics.

6. The management device of claim 5, wherein the processor is further configured to:

acquire an open circuit voltage of the remaining power storage module as a connection candidate, derive, based on the SOC-maximum charge characteristics and the current SOC of each of the plurality of power storage modules connected to the power supply, the third maximum value of current or power allowed to charge each of the plurality of power storage modules connected to the power supply, estimate a closed circuit voltage of each of the plurality of power storage modules connected to the power supply when each of the plurality of power storage modules connected to the power supply is charged with the third maximum value, and prevent the at least one second switch from being turned on when the open circuit voltage of the connection candidate is higher than the closed circuit voltage.

7. The management device of claim 5, wherein the processor is further configured to:

determine the second maximum value by estimating the second maximum value, when an open circuit voltage of each of the power storage modules connected to the power supply corresponds with an open circuit voltage of the connection candidate, based on the SOC-maximum charge characteristics, an open circuit voltage corresponding to the open circuit voltage of each of the plurality of power storage modules connected to the power supply, and an open circuit voltage corresponding to the open circuit voltage of the connection candidate, and prevent the at least one second switch from being turned on when the second maximum value is lower than the threshold based on the first maximum value.

* * * * *